(12) United States Patent
Ley

(10) Patent No.: US 6,362,522 B1
(45) Date of Patent: Mar. 26, 2002

(54) COOL FRAME FOR PROTECTING PACKAGED ELECTRONIC DEVICES

(75) Inventor: Tom Ley, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/612,589

(22) Filed: Jul. 10, 2000

Related U.S. Application Data

(60) Provisional application No. 60/214,428, filed on Jun. 28, 2000.

(51) Int. Cl.[7] ................................................ H01L 23/12

(52) U.S. Cl. ..................... 257/711; 257/712; 257/713; 257/719

(58) Field of Search ................................ 257/711, 712, 257/713, 718, 719, 707, 720, 675

(56) References Cited

U.S. PATENT DOCUMENTS 5,959,353 A * 9/1999 Tomita ........................ 257/729
6,140,707 A * 10/2000 Plepys et al. ............... 257/778

FOREIGN PATENT DOCUMENTS

JP         11126835 A  * 10/1997

* cited by examiner

Primary Examiner—Olik Chaudhuri
Assistant Examiner—Dilinh Nguyen
(74) Attorney, Agent, or Firm—McDermott, Will & Emery

(57) ABSTRACT

An integrated circuit arrangement having an integrated circuit package contains an integrated circuit device mounted to a surface of the package. A flat frame is placed on the package surface and substantially surrounds the device. The flat frame has a central opening that receives the integrated circuit device. The height of the flat frame is relative to the height of the circuit device. A heat sink is mounted to the circuit device such that the bottom of the heat sink contacts the upper surface of the integrated circuit device but, does not contact the flat frame.

11 Claims, 4 Drawing Sheets

COOL FRAME FOR PROTECTING PACKAGED ELECTRONIC DEVICES

RELATED APPLICATIONS

This application claims priority from U.S. Provisional Patent Application Ser. No. 60/214,428 filed Jun. 28, 2000, which is incorporated herein by reference.

FIELD OF THE INVENTION

The present invention relates to integrated circuit arrangements and, more particularly, to the attachment of a heat sink to an integrated circuit device.

DESCRIPTION OF RELATED ART

Integrated circuit devices mounted to integrated circuit package boards generate large amounts of heat when operated. The generated heat must be dissipated, otherwise the life of the circuit devices will be shortened and the effectiveness of the circuit devices degraded.

A common arrangement for dissipating heat is to utilize a thermally conductive lid that covers and protects a circuit device. Sometimes the increased surface area of the lid is not enough to dissipate sufficient quantities of heat, so a heat sink is mounted to the lid to enhance heat dissipation. Adding a lid to an integrated circuit arrangement, however, increases the cost of the arrangement and increases manufacturing complexity. Therefore, many integrated circuit arrangements do not include a lid for covering and protecting a circuit device, but there remains a need to dissipate excess heat generated by circuit devices.

Accordingly, another common arrangement for dissipating heat is to utilize a heat sink mounted directly onto a circuit device. Heat sinks are manually mounted directly to the circuit device to thermally couple the circuit device and the heat sink. Typically, a heat sink is constructed from highly thermally conductive materials and is exposed to the ambient air or to air moved by some type of cooling fan. The heat sink, thermally coupled to the integrated circuit device, draws heat from the circuit device through conduction. The ambient air, or air moved by the cooling fan, passes over the heat sink to cool the heat sink by convection. As a result, the heat generated by the circuit device is dissipated to the surrounding air.

There are problems related to manually mounting a heat sink directly to a circuit device. Some of these problems relate to the fact that the surface area of a heat sink is large compared to the surface area of a circuit device. It is difficult to properly align a heat sink on top of a circuit device because a person manually mounting the heat sink cannot easily see the circuit device. The relatively small surface area of a circuit device also makes it easy to mount the heat sink at an angle, so that the plane formed by the bottom of the heat sink is not parallel with the plane formed by the top of the circuit device.

Improper alignment of a heat sink on a circuit device leads to inefficient use of the heat sink. An efficient placement for a heat sink is centering the heat sink on the circuit device. Centering the heat sink on the circuit device provides even dissipation of heat generated by the device throughout the entire heat sink. When the heat sink is not properly centered, some portions of the heat sink become hotter than other portions, resulting in uneven and slower heat dissipation from the device to the heat sink. As a result of the uneven dissipation of generated heat, the circuit device may overheat and become damaged, thereby degrading the device's performance and shortening its operational life.

In addition to mis-centering, a poor thermal interface between the heat sink and the circuit device may occur when the heat sink is not flatly mounted, i.e., the plane formed by the underside of the heat sink is not parallel with the plane formed by the top of the circuit device. An optimal thermal interface occurs when the heat sink is flatly mounted onto the circuit device so that the heat sink is as close as possible to the circuit device, and there is a minimum amount of adhesive between the circuit device and the heat sink. However, when a heat sink is manually mounted onto a circuit device it is easy to improperly mount the heat sink at an angle, instead of flatly on the circuit device. An angle between the heat sink and the circuit device means that a portion of the heat sink is unnecessarily located away from the circuit device, and there will be greater quantities of adhesive between the heat sink and the circuit device, resulting in a poor thermal interface. A poor thermal interface reduces conduction between the device and the heat sink, thereby reducing the heat sink's ability to dissipate heat generated by the circuit device. This creates the possibility that the circuit device will overheat and become damaged which degrades the device's performance and shortens its operational life.

Even when a heat sink is properly centered and flatly mounted on a circuit device, several problems can arise. Too much pressure on an edge of a heat sink when connecting an integrated circuit package to a motherboard, for example, creates a force strong enough to tilt or disconnect the heat sink from the circuit device. Rocking of the heat sink, if the integrated circuit package is part of a laptop computer or the electronics in a vehicle for example, could also occur. Rocking of a heat sink on a circuit device results in the device becoming chipped or the heat sink losing optimal thermal contact with the device, either of which detrimentally affects the performance of the device and its operational life.

SUMMARY OF THE INVENTION

There is a need for mounting a heat sink in a manner that reduces tilting and off-centering of a heat sink during the mounting process. There is also a need to reduce rocking of a heat sink mounted on an integrated circuit arrangement during operation of the electronic unit in which the integrated circuit arrangement is incorporated, to reduce the risk of damage to the circuit device, and to provide consistent thermal contact between the device and the heat sink.

These needs and others are met by embodiments of the present invention which provide a flat structure that is substantially the same height as, but lower than, an integrated circuit device that is coupled to a surface of a package.

Accordingly, one aspect of the invention relates to an integrated circuit arrangement that comprises a package having an integrated circuit device coupled to a surface of the package. A structure that is substantially the same height as, but lower than, the circuit device is also placed on the surface of the package. A heat sink is mounted onto the circuit device and is not supported by the structure, but the structure prevents the heat sink from substantially tilting.

Another aspect of the invention relates to a method of making an integrated circuit arrangement. The method comprises the steps of coupling an integrated circuit device to a surface of a package, placing a structure configured to be substantially the same height as, but lower than, the height of the integrated circuit device on the surface of the package, and mounting a heat sink to the integrated circuit device. The structure prevents the heat sink from substantially tilting.

Utilizing a flat structure on the surface of a package in accordance with embodiments of the present invention assists mounting a heat sink to a circuit device and promotes flat, thermal contact between the heat sink and the integrated circuit device. A flat structure also prevents the heat sink from substantially tilting during installation and operation of the electronic unit, and prevents damage to the device during heat sink installation and removal.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention addresses and solves problems related to properly centering a heat sink on an integrated circuit device, and preventing substantial tilting of a heat sink. This is achieved by providing a structure on the surface of an integrated circuit package that is substantially the same height as, but lower than, the height of an integrated circuit device coupled to the surface of the package. The structure lies underneath the heat sink, and because the height of the structure is substantially the same as the height of the device on which the heat sink is mounted, the heat sink is prevented from substantially tilting by contact with the structure.

Figure 1:
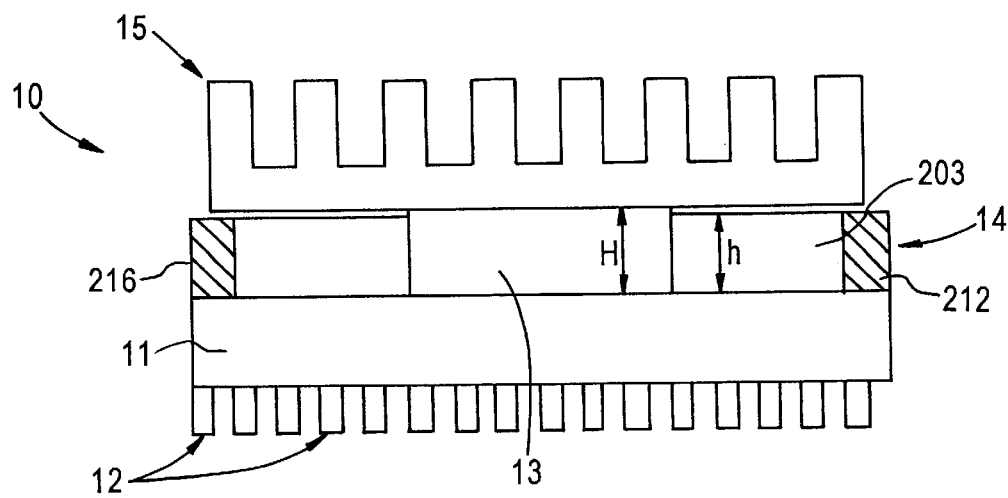
FIG. 1 is a cross-sectional side view of an integrated circuit arrangement having an embodiment of a flat cool frame according to the present invention.

Referring now to the drawings and initially to FIG. 1, a cross-sectional side view of an integrated circuit arrangement is depicted. The integrated circuit arrangement 10 includes a package 11 with an integrated circuit device 13 coupled to the package 11, by flip-chip technique for example. However, other connection techniques may be employed to connect the integrated circuit device 13 to the package 11. A flat cool frame 14 is placed on the surface of the package 11 and substantially surrounds the periphery of the device 13. The package 11 can comprise a rigid material, for example a PC board material, or can comprise a flexible material, such as thin copper for example. The flat frame 14 can be attached to the surface of the package 11, for example through the use of an adhesive (not shown), or can simply rest on the surface of the package 11. Other structures that are attached to the surface of the package 11, for example two substantially parallel members 16 (FIG. 4) or a series of posts 17 (FIG. 5), can be used. A heat sink 15 is mounted onto the device 13, and, along with dissipating heat, serves to hold the flat frame 14 onto the surface of the package 11 if the flat frame 14 is not attached to the surface of the package 11.

As seen in FIG. 1, the height, h, of the flat frame 14 is substantially the same as the height, H, of the device 13. However, the height, h, of the flat frame 14 is always less than the height, H, of the device 13. By making the height, h, of the flat frame 14 less than the height, H, of the device 13, a flat, consistent thermal interface between the device 13 and the heat sink 15 is ensured, as shown in FIG. 1.

Placing a flat frame 14 around the device 13 and underneath the heat sink 15 prevents the heat sink 15 from tilting by more than the height difference between the height of the device and the height of the flat frame 14, (H-h). Preventing substantial tilting of the heat sink 15 ensures that a good thermal interface between the device 13 and the heat sink 15 is maintained throughout the life of the integrated circuit arrangement 10. A good thermal interface is needed to prevent the device 13 from becoming overheated and damaged. Preventing substantial tilting of the heat sink 15 also reduces the possibility of chipping or other damage to the device 13.

Placing a flat frame 14 on the surface of a package 11 assists in the process of mounting a heat sink 15 to the device 13. The flat frame 14 forms a point of reference for the mounting of a heat sink 15 onto the device 13, thereby improving alignment of the heat sink 15 on the device 13. Proper alignment of the heat sink 15 on the device 13 results in even dissipation of heat generated by the devise 13 throughout the entire heat sink 15 and, therefore, a maximum dissipation of heat. Mounting the heat sink can be accomplished by a mechanical process as well as by a manual process.

The flat frame 14 also prevents mounting of the heat sink 15 at too great of an angle on the device 13, thereby improving the flatness, and therefore the thermal conductivity, of the thermal interface between the heat sink 15 and the device 13. The flatly mounted heat sink 15 maximizes the surface contact between the heat sink 15 and the device 13 resulting in optimized heat transfer from the device 13 to the heat sink 15.

Figure 4:
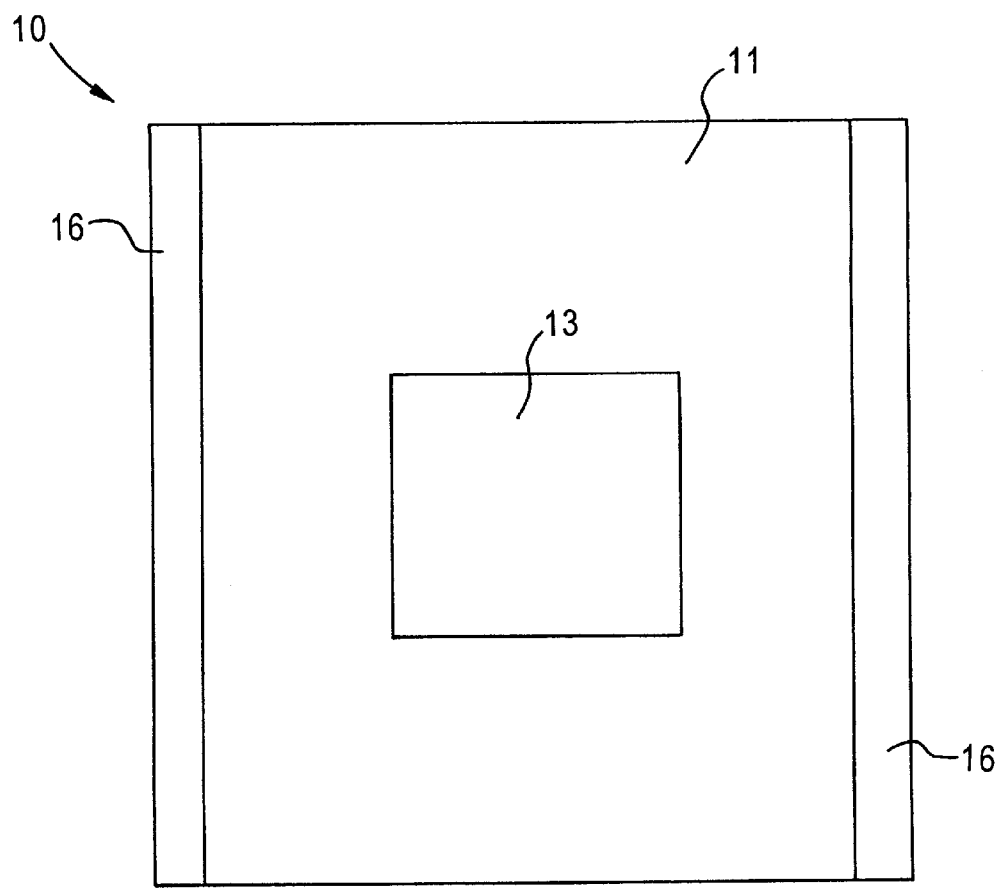
FIG. 4 is a top view of an integrated circuit arrangement, without an attached heat sink having an embodiment of parallel members according to the present invention.

FIG. 4 is a top view of an integrated circuit arrangement 10 before a heat sink 15 is mounted on the device 13. In FIG. 4, an embodiment of the invention, substantially parallel members 16, perform the same functions as the flat cool frame 14 embodiment of the invention shown in FIG. 1. However, the substantially parallel members 16 need to be attached to the surface of the package 11 because the heat sink 15 (not shown) will not suffice to retain the substantially parallel members 16 on the surface of the package 11.

Figure 5:
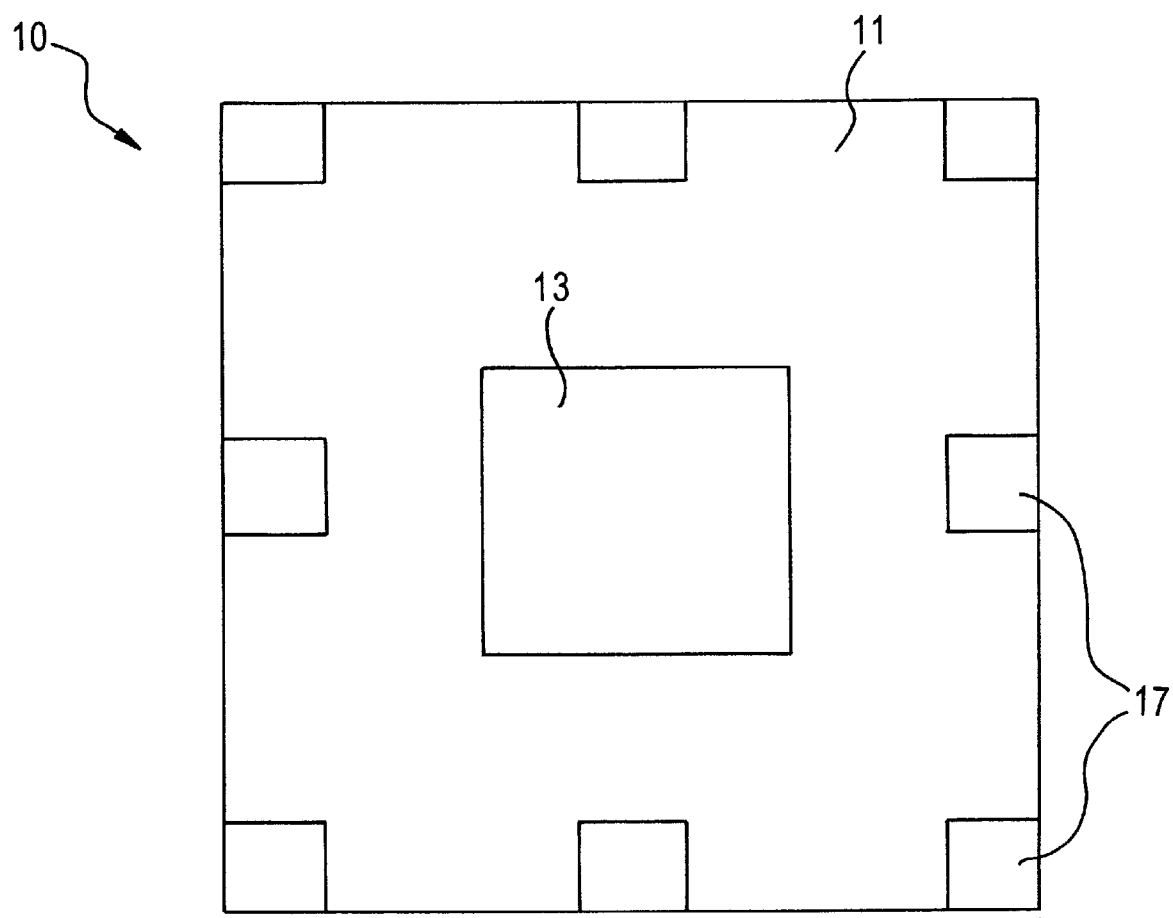
FIG. 5 is a top view of an integrated circuit arrangement, without an attached heat sink, having an embodiment of posts according to the present invention.

FIG. 5 is another top view of an integrated circuit arrangement 10 before a heat sink 15 is mounted on the device 13. In FIG. 5, an embodiment of the invention, posts 17, perform the same functions as the flat cool frame 14 embodiment of the invention shown in FIG. 1. However, the posts 17 need to be attached to the surface of the package 11 because the heat sink 15 (not shown) will not suffice to retain the posts 17 on the surface of the package 11.

Figure 2A:
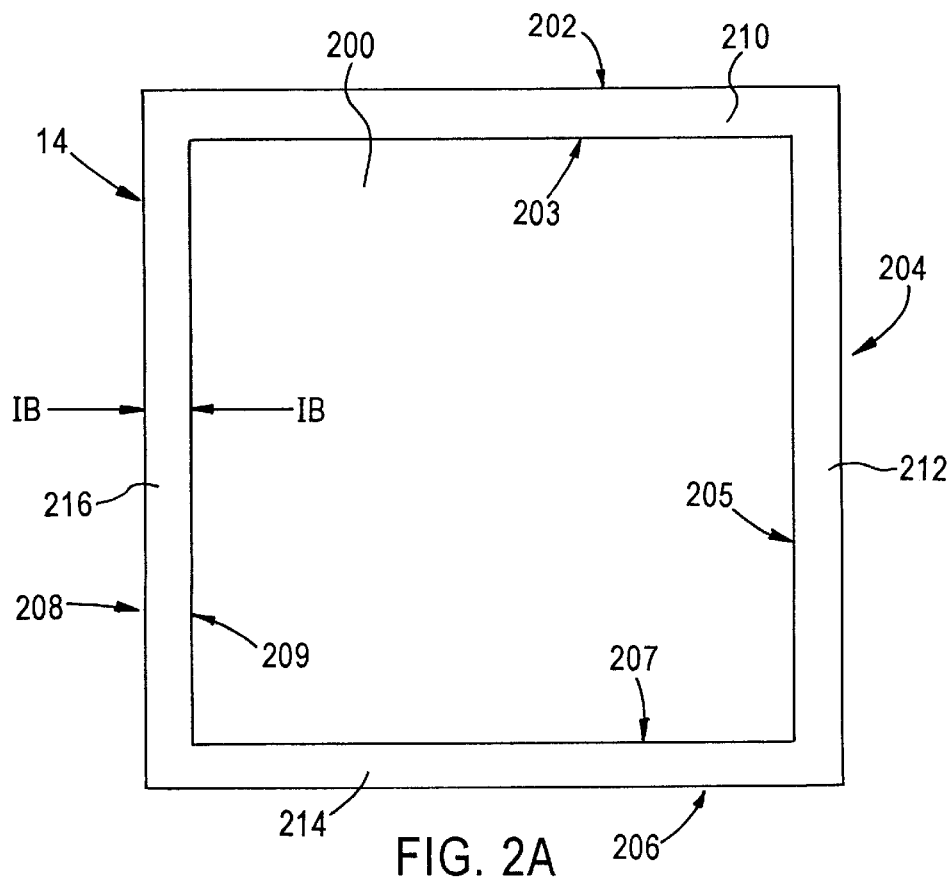
FIGS. 2A and 2B are a top view and a cross-sectional side view, respectively, of an embodiment of a flat cool frame according to the present invention.
Figure 2B:
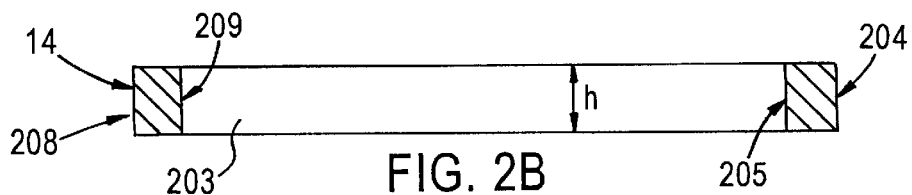

FIGS. 2A and 2B are a top view and sectional side view, respectively, of the substantially square, flat cool frame 14 depicted in FIG. 1. The flat cool frame has four walls 210, 212, 214, and 216 having outer surfaces 202, 204, 206, and 208 of approximately equal lengths, and inner surfaces 203, 205, 207, and 209 of approximately equal lengths. Although the flat cool frame 14 of FIGS. 2A and 2B is square, the frame 14 may take other shapes including, but not limited to, rectangular, polygonal, circular, and trapezoidal without departing from the invention.

The flat cool frame 14 has an opening 200 defined by the inner surfaces 203, 205, 207, and 209. Although shown distanced from the device 13 (FIG. 1), in other embodiments of the invention the inner surfaces 203, 205, 207, and 209 are configured closer to the device 13, and may contact the periphery of the device 13. The size of the frame 14, including the height, h, of the walls 210, 212, 214, and 216, depends upon the size of the package 11 (FIG. 1), and the size of the device 13 (FIG. 1); and is readily determined by one of ordinary skill in the art given the description of the invention. For example, the height, h, of the walls 210, 212, 214, and 216 can be 90–99% of the height, H, of the device 13. Optimally, the height, h, of the walls 210, 212, 214, and 216 is 95–98% of the height, H, of the device 13.

The flat cool frame 14 of FIGS. 2A and 2B is made of a metal, which is preferably an anodized aluminum. However, various other materials may be used, for example a resin or cardboard, without departing from the invention. Ideally, a material that closely matches the coefficient of thermal expansion for the circuit device 13 is used in embodiments in which the flat cool frame 14 is attached to the package 11. Matching the coefficient of thermal expansion is not a consideration in embodiments in which the flat cool frame 14 is not attached to the package 11 because when the frame is not attached to the package it is free to expand and contract independent of the package's expansions and contractions. Although shown as solid walls, the walls 210, 212, 214, and 216 in other embodiments have apertures therethrough, for example a honeycomb or lattice-type structure.

Figure 3A:
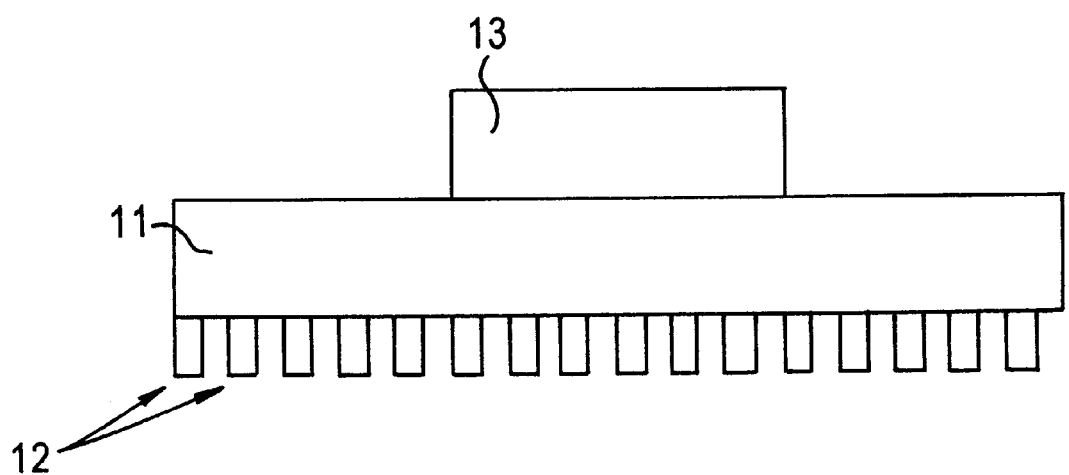
FIGS. 3A–3C are cross-sectional side views of assembling an integrated circuit arrangement having an embodiment of a flat cool frame according to the present invention.
Figure 3B:
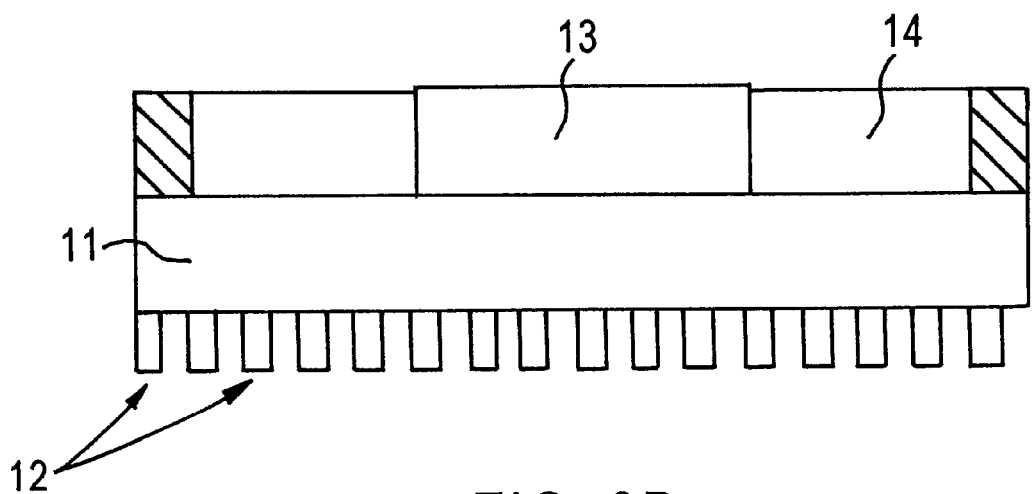
Figure 3C:
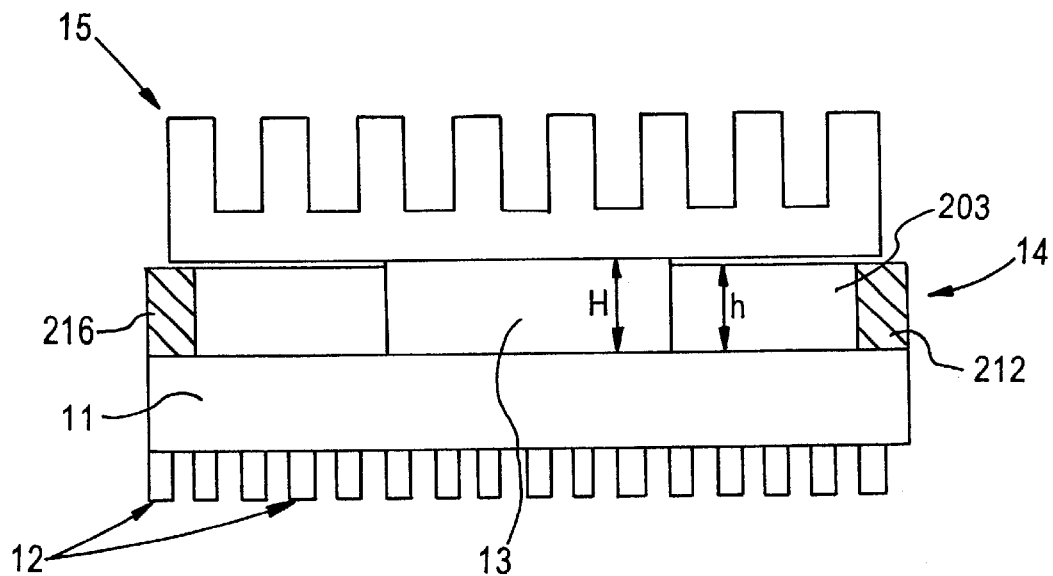

An exemplary method of assembly for an integrated circuit arrangement according to the present invention is shown in FIGS. 3A–3C. FIG. 3A is a cross-sectional side view of the package 11 with an integrated circuit device 13 coupled, for example by flip-chip technique, to a surface of the package 11. FIG. 3B is a cross-sectional side view of the integrated circuit arrangement of FIG. 1A after a flat cool frame 14 is placed onto the surface of the package 11. In one embodiment, the flat cool frame 14 is loose on the surface of the package 11. In another embodiment, the frame 14 is attached to the surface of the package 11 by an adhesive, such as epoxy for example. FIG. 3C is a cross-sectional side view of the integrated circuit arrangement of FIG. 3B depicting a heat sink 15 mounted onto the device 13. Mounting the heat sink 15 involves placing an adhesive, epoxy for example, on top of the device 13, then manually placing the heat sink 15 on top of the device 13. The heat sink 15 could also be mechanically placed on the device 13. The flat cool frame 14 serves as a guide so that the heat sink 15 is properly centered on the device 13. The flat cool frame 14 also prevents the heat sink 15 from substantially tilting during mounting, assisting in forming a flat contact between the device 13 and the heat sink 15.

As shown in FIGS. 3A–3C, the assembled integrated circuit arrangement includes a flat cool frame 14 according to the embodiment of FIGS. 2A and 2B. As seen in FIG. 3C, the integrated circuit device 13 has a height, H, that is slightly greater than the height, h, of the flat cool frame 14, so that the mounted heat sink 15 does not contact the flat cool frame 14. Also, the walls 210, 212, 214 (not shown), and 216 of the flat cool frame 14 completely surround the integrated circuit device 13.

Utilizing a flat cool frame has several advantages over simply mounting a heat sink onto a circuit device. The flat cool frame aids in ensuring flat contact between the top surface of a device and the bottom surface of a heat sink during mounting and thereafter. Moreover, the flat cool frame is not adversely affected by the level of heat generated in an integrated circuit environment and, therefore, its properties will not change substantially over time. The flat cool frame is also easy to remove and rework if necessary.

A flat cool frame is also advantageous compared to utilizing a lid for manufacturing reasons. For example, because the flat cool frame can be made from a stamping procedure, the cool frame is much more cost effective compared to known lid structures. Also, the stamping process, which punches out the center portion of a metal blank, yields recoverable recyclable waste that reduces the cost of production. The flat cool frame can also be integrated into many existing manufacturing processes.

Another advantage of the flat cool frame is the rigid structure it provides during handling and installation of the integrated circuit arrangement and the heat sink. Moreover, the flat cool frame provides an additional surface for marking the parts prior to distribution. In addition, an OEM or end user cannot tear the flat cool frame and expose the circuit device when working near the package.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. An integrated circuit arrangement comprising:
   a package;
   an integrated circuit device coupled to a surface of the package;
   a structure on the surface of the package where the height of the structure is substantially the same as, but lower than, the height of the integrated circuit device; and
   a heat sink mounted to the integrated circuit device wherein the structure prevents the heat sink from substantially tilting with respect to the integrated circuit device.

2. The arrangement of claim 1, wherein:
   the package is rigid.

3. The arrangement of claim 1, wherein:
   the package is flexible.

4. The arrangement of claim 1, wherein:
   the perimeter of the structure is substantially the same as the perimeter of the package.

5. The arrangement of claim 1, wherein:
   the structure is attached to the surface of the package.

6. The arrangement of claim 1, wherein:
the structure is made of metal.
7. The arrangement of claim 6, wherein:
the metal is anodized aluminum.
8. The arrangement of claim 1, wherein:
the structure is a frame comprising substantially a square having an aperture therethrough.
9. The arrangement of claim 8, wherein:
the frame substantially surrounds the integrated circuit device in the frame aperture.

10. The arrangement of claim 1, wherein:
the structure comprises substantially parallel members on opposite sides of the circuit device, and the substantially parallel members are attached to the surface of the package.
11. The arrangement of claim 1, wherein:
the structure comprises a plurality of posts located around the perimeter of the circuit device, and the posts are attached to the surface of the package.

\* \* \* \* \*